United States Patent
Hwang et al.

(10) Patent No.: US 12,169,365 B2
(45) Date of Patent: Dec. 17, 2024

(54) COMPUTER-READABLE STORAGE MEDIUM RECORDING DATA STRUCTURE FOR STORING DATA CONTROLLING OPERATION OF OVERLAY MEASUREMENT DEVICE AND OVERLAY MEASUREMENT DEVICE THEREFOR

(71) Applicant: AUROS TECHNOLOGY, INC., Hwaseong-si (KR)

(72) Inventors: Sol-Lee Hwang, Hwaseong-si (KR); Dong-Won Jung, Hwaseong-si (KR); Hee-Chul Lim, Hwaseong-si (KR); Hyun-Kyoo Shon, Hwaseong-si (KR); Min-Ho Lee, Hwaseong-si (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 18/433,486

(22) Filed: Feb. 6, 2024

(65) Prior Publication Data
US 2024/0176253 A1    May 30, 2024

Related U.S. Application Data

(63) Continuation of application No. 18/142,886, filed on May 3, 2023, now Pat. No. 11,960,214.

(30) Foreign Application Priority Data

Nov. 14, 2022  (KR) .................. 10-2022-0151955

(51) Int. Cl.
G03F 7/00    (2006.01)

(52) U.S. Cl.
CPC ...... *G03F 7/70641* (2013.01); *G03F 7/70625* (2013.01); *G03F 7/70633* (2013.01)

(58) Field of Classification Search
CPC ............ G03F 7/70625; G03F 7/70633; G03F 7/70641
USPC ..................................... 430/22, 30
See application file for complete search history.

(56) References Cited

U.S. PATENT DOCUMENTS

2008/0177408 A1    7/2008  Kokotov et al.

FOREIGN PATENT DOCUMENTS

| KR | 10-1999-0074610 A | 10/1999 |
| KR | 10-2001-0058692 A | 7/2001 |
| KR | 10-2003-0016458 A | 3/2003 |
| KR | 10-2004-0099928 A | 12/2004 |
| KR | 10-2006-0043963 A | 5/2006 |
| KR | 10-2008-0036901 A | 4/2008 |
| KR | 10-2014-0053141 A | 5/2014 |
| KR | 10-2016-0138778 A | 12/2016 |
| KR | 10-2019-0051071 A | 5/2019 |
| KR | 10-2019-0142390 A | 12/2019 |
| KR | 10-2022-0038707 A | 3/2022 |
| TW | 201246423 A | 11/2012 |
| TW | 202212987 A | 4/2022 |
| TW | 202232092 A | 8/2022 |

OTHER PUBLICATIONS

Taiwanese Office Action for related TW Application No. 112127256 mailed Mar. 28, 2024 from Taiwan Intellectual Property Office.
Korean Office Action for related KR Application No. 10-2022-0151955 mailed Feb. 6, 2023 from Korean Intellectual Property Office.
Korean Notice of Allowance for related KR Application No. 10-2022-0151955 mailed Apr. 26, 2023 from Korean Intellectual Property Office.

*Primary Examiner* — Christopher G Young
(74) *Attorney, Agent, or Firm* — Paratus Law Group, PLLC

(57) ABSTRACT

A non-transitory computer-readable storage medium that records a data computer-readable storage medium that records a data structure for storing data controlling an operation of an overlay measurement device that measures an error between a first overlay mark and a second overlay mark formed on different layers of a wafer. The data include information of a recipe that is input to allow the overlay measurement device to measure characteristics of a wafer through a manager program installed in a user terminal, and unique information of the overlay measurement device.

8 Claims, 12 Drawing Sheets

COMPUTER-READABLE STORAGE MEDIUM RECORDING DATA STRUCTURE FOR STORING DATA CONTROLLING OPERATION OF OVERLAY MEASUREMENT DEVICE AND OVERLAY MEASUREMENT DEVICE THEREFOR

CROSS-REFERENCE TO RELATED APPLICATION

This application is a Continuation application of U.S. patent application Ser. No. 18/142,886 (file on May 3, 2023), which claims priority to Korean Patent Application No. 10-2022-0151955 (filed on Nov. 14, 2022), which is hereby incorporated by reference in its entirety.

BACKGROUND

The present disclosure relates to a computer-readable storage medium and an overlay measurement device therefor that records a data structure for storing data controlling the operation of an overlay measurement device.

With the advancement of technology, the size of a semiconductor device measuring the characteristics of a wafer decreases, and the density of the integrated circuit of a measurement device increases. For an integrated circuit to be formed on a wafer, a desired circuit structure and desired elements need to be consecutively formed in a specific position, in a series of manufacturing processes. In the manufacturing processes, a patterned layer is consecutively formed on a wafer.

In the repetitive stack processes, an electrically activated pattern is generated in the integrated circuit. At this time, unless each structure is arranged within a range of errors that are allowable in the production process, since electrically activated patterns interfere with one another, the performance and reliability in manufactured circuits deteriorate. To measure and verify an arrangement error among the layers, the manager inputs or sets a recipe for measuring the characteristics of a wafer.

However, conventionally, the manager inputs a recipe directly at a measurement device, causing temporal and spatial restrictions.

In addition, conventionally, the manager directly selects and measures options of a filter, an aperture, a focus, a pinhole and the like and checks a value, in a repetitive manner, to determine an optimal option. At this time, the workmanship, ability and experience of the manager are important factors. Thus, efficient measurement of the characteristics of a wafer, based on optimized options, is hardly performed.

To solve the problem, a minimum amount of information required for optimization needs to be transmitted to a measurement device, and the measurement device needs to perform optimization of options.

Further, a data structure for transmitting information on optimized options to a measurement device is required.

SUMMARY

The objective of the present disclosure is to provide a computer-readable storage medium and an overlay measurement device therefor that records a data structure for storing data controlling an operation of an overlay measurement device.

The objective of the present disclosure is to provide a data structure for transmitting information on options to be used for optimization to a measurement device.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

In a computer-readable storage medium that records a data structure for storing data controlling the operation of an overlay measurement device of one embodiment, data may comprise information of a recipe that is input to allow the overlay measurement device to measure characteristics of a wafer through a manager program installed in a user terminal, and unique information of the overlay measurement device.

An overlay measurement device of one embodiment may comprise a transmission and receipt part; and a processor electrically connecting to the transmission and receipt part, the processor may be configured to obtain data controlling an operation of the overlay measurement device from a user terminal through the transmission and receipt part and to control the operation of the overlay measurement device, based on the obtained data, and the data may comprise information of a recipe that is input to allow the overlay measurement device to measure characteristics of a wafer, and unique information of the overlay measurement device.

According to the present disclosure, a user terminal generates and transmits data comprising information on a recipe that is input through a manager program, and unique information on a measurement device, such that the user readily controls the measurement device remotely.

According to the present disclosure, at least part of information on configuration of a wafer map, information of at least one of measurement options in relation to the wafer, information of at least one of additional options in relation to the wafer, and information indicating whether optimization of the measurement options of the wafer is performed are included in the data, such that control measurement of the wafer is controlled remotely.

According to the present disclosure, at least part of a diameter of the wafer, a X-distance and a Y-distance of a field, a central coordinate of the field, information as to whether to use a field that is not completely in the wafer, a thickness that is not to be measured at an end of the wafer, and additional information to be transmitted later are included in the information on configuration of a wafer map, such that a wafer map is configured remotely.

According to the present disclosure, at least part of information of settings in relation to target measurement, information on optical settings at a time of measurement, and information of algorithm settings used at a time of measurement are included in the information on at least one of measurement options in relation to the wafer, such that at least one of the measurement options in relation to the wafer is set remotely.

According to the present disclosure, at least part of information on a selection of a measurement mode, information as to whether to use an image storage function, information as to whether to use an auto data file storage function, information as to whether to use a manual assist function, information on conditions for performance of an auto pinhole optimization function, information as to whether to use an auto wafer center calibration function, and information as to whether to use a target finder function are included in at least one of the additional options in relation to the wafer, such that at least one of the additional options in relation to the wafer is set remotely.

According to the present disclosure, at least part of information on a filter optimization process, information on an aperture optimization process, information on a focus optimization process, and information on a pinhole optimization process are included in the information indicating whether to perform optimization of the measurement options of the wafer, such that optimization in relation to measurement of the wafer is performed remotely.

Specific effects are described along with the above-described effects in the section of detailed description.

BRIEF DESCRIPTION OF THE DRAWINGS

The accompanying drawings constitute a part of the specification, illustrate one or more embodiments in the disclosure, and together with the specification, explain the disclosure.

DETAILED DESCRIPTION

Figure 1:
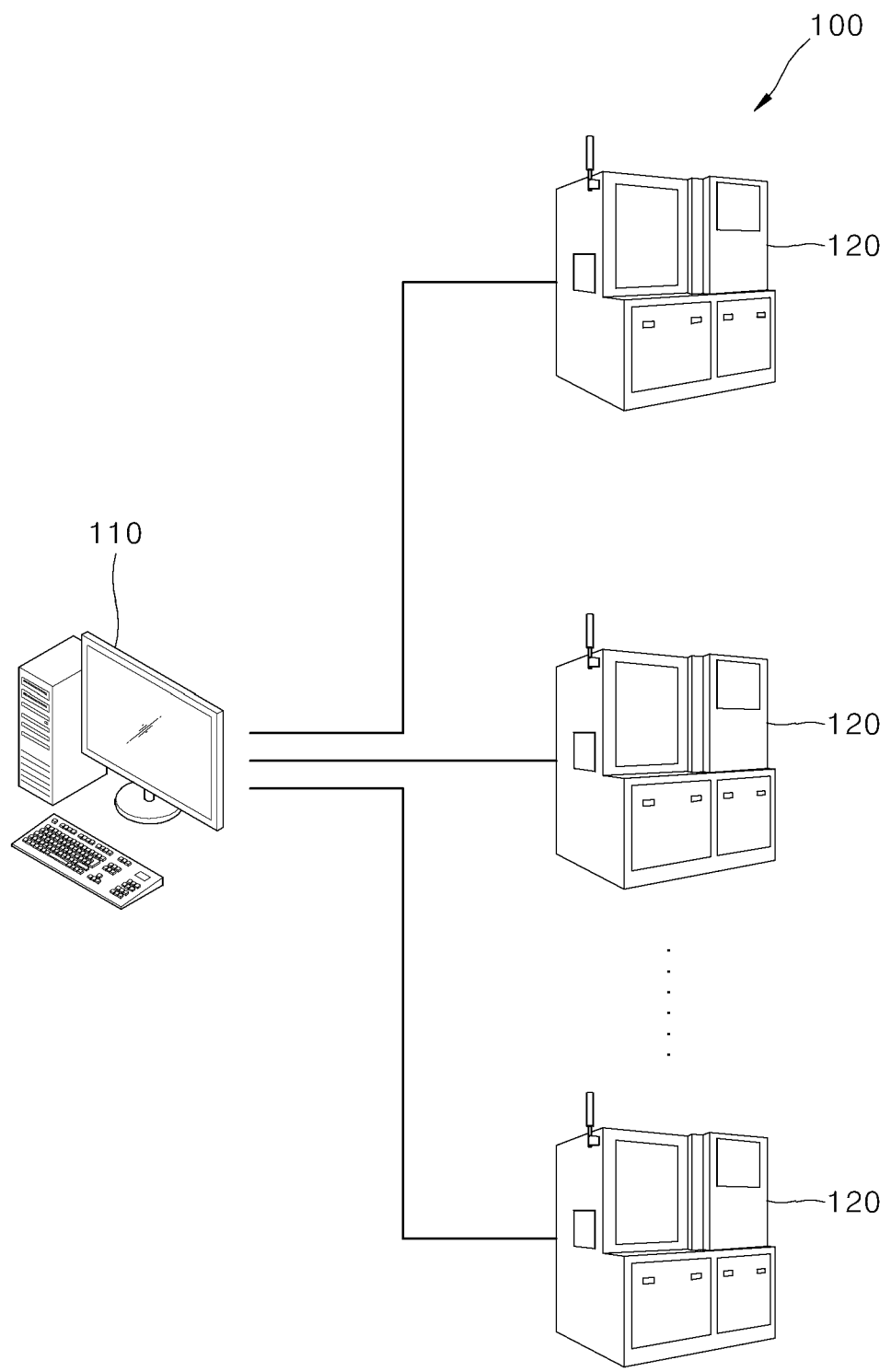
FIG. 1 is an exemplary view showing an overlay measurement system in one embodiment.

The above-described aspects, features and advantages are specifically described hereafter with reference to the accompanying drawings such that one having ordinary skill in the art to which the present disclosure pertains can embody the technical spirit of the disclosure easily. In the disclosure, detailed description of known technologies in relation to the subject matter of the disclosure is omitted if it is deemed to make the gist of the disclosure unnecessarily vague. Hereafter, preferred embodiments according to the disclosure are specifically described with reference to the accompanying drawings. In the drawings, identical reference numerals can denote identical or similar components.

The terms "first", "second" and the like are used herein only to distinguish one component from another component. Thus, the components should not be limited by the terms. Certainly, a first component can be a second component, unless stated to the contrary.

When one component is described as being "in the upper portion (or lower portion)" or "on (or under)" another component, one component can be directly on (or under) another component, and an additional component can be interposed between the two components.

When any one component is described as being "connected", "coupled", or "connected" to another component, any one component can be directly connected or coupled to another component, but an additional component can be "interposed" between the two components or the two components can be "connected", "coupled", or "connected" by an additional component.

Throughout the disclosure, each component can be provided as a single one or a plurality of ones, unless explicitly stated to the contrary.

The singular forms "a", "an" and "the" are intended to include the plural forms as well, unless explicitly indicated otherwise. It is to be further understood that the terms "comprise" or "include" and the like, set forth herein, are not interpreted as necessarily including all the stated components or steps but can be interpreted as excluding some of the stated components or steps or can be interpreted as including additional components or steps.

Throughout the disclosure, the terms "A and/or B" as used herein can denote A, B or A and B, and the terms "C to D" can denote C or greater and D or less, unless stated to the contrary.

Hereafter, described are a computer-readable storage medium recording a data structure for storing data controlling the operation of an overlay measurement device and an overlay measurement device therefor, in several embodiments.

FIG. 1 is an exemplary view showing an overlay measurement system in one embodiment.

Referring to FIG. 1, the overlay measurement system 100 in one embodiment may comprise a user terminal 110 (e.g., a computer, a laptop and the like), and at least one of measurement devices 120.

In one embodiment, the user terminal 110 may transmit data or signals to at least one of the measurement devices 120 and receive the same from at least one of the measurement devices 120, through a communication protocol (e.g., a file transfer protocol (FTP)). For example, the user terminal 110 may transmit data or signals to one measurement device, or transmit data or signals to a plurality of measurement devices at the same time.

In one embodiment, the user terminal 110 may execute a manager program (e.g., an auto recipe optimization (ARO) manager program) to which information on at least one of the measurement devices 120 is input by the user. The manager program may receive recipe information on the operation of a measurement device that measures the characteristics of a wafer, from the user. For example, the manager program may receive a value of the plurality of parameters for measuring the characteristics of a wafer, from the user.

The manager program, as described above, is installed in the user terminal 110. Through the manager program, the user terminal 110 may synchronize with the measurement device 120, and transmit signals or data to the measurement device 120 and receive the same from the measurement device 120, in real time.

The user interface (UI) of the manager program (e.g., an ARO manager program) installed in the user terminal 110 may be similar to the UI installed in the measurement device. Additionally, the manager program may create a recipe file as options to be set are checked and stored in a recipe. The values of the recipe options are set to initial values basically, as a recipe is generated, and can change, when the user wants. A file generated in the user terminal 110 may be transmitted to the measurement device to measure a recipe, through a FTP.

To send a recipe file to the measurement device, information on a PC IP address, an identifier, a password and a server IP address of the device needs to be input to the manager program. In the case where the information is input normally, the user terminal 110 may register the FTP paths of files that are stored in the measurement device and used to create a recipe. Additionally, the information is necessary for a manager program that is not input to the measurement device.

Files stored in equipment may contain a filter list and an aperture list that are used for each piece of equipment, and a template list that is used for a focus and a pinhole, and version information of each measurement device, and the like.

Since the manager program may transmit a recipe to different measurement devices at the same time, the different devices may be registered additionally, based on repetition of the above process. Each of the measurement devices needs to be registered, at least once. Additionally, when necessary, registered measurement devices may be deleted or changed.

Further, a recipe may be created in the state where the user knows about information of a wafer in advance, but the information on a wafer may be reconfigured with a data file in a corresponding tool. Even if the user does not know about information on a wafer, a data file on the measurement of the wafer can be loaded to create a recipe.

In one embodiment, the user terminal 110 may generate data comprising information on an input recipe, and unique information (e.g., the Internet Protocol (IP) address of a measurement device, the identifier of a measurement device, a password, and the IP address of a server) on a measurement device 120. For example, the user terminal 110 may respectively generate data comprising information on a recipe, and unique information on a measurement device, for each of the measurement devices.

In one embodiment, the user terminal 110 may generate data comprising information that indicates whether an optimization process is performed in relation to measurement options of the wafer, for each measurement device.

In one embodiment, the user terminal 110 may transmit the generated data to a measurement device corresponding to unique information. For example, the user terminal 110 may transmit data or signals to one measurement device, or to each of the plurality of measurement devices at the same time.

The user terminal 110, as described above, may generate a plurality of data comprising unique information of each of the plurality of measurement devices, and transmit the plurality of generated data to a corresponding measurement device at the same time.

In one embodiment, the measurement device 120 may analyze a recipe included in the data that are received from the user terminal 110, and after the analysis of the recipe is completed, optimize the measurement options of a wafer, based on the recipe.

For example, the manager program installed in the user terminal 110, and measurement software (e.g., an overlay application) installed in the measurement device 120 may transmit and receive data through an FTP.

In one embodiment, the measurement software (e.g., an overlay application) installed in the measurement device 120 may operate by linking with the manager program installed in the user terminal 110, and comprise instructions to operate the measurement device based on the data (e.g., recipe information) received from the user terminal 110.

In one embodiment, the measurement device 120 may continue to check a path in which the recipe file is received from the user terminal 110, with a thread, in the state where the measurement software is being executed.

In one embodiment, when receiving the recipe file, the measurement device 120 may see whether the file is a recipe file, by using at least one of the form of the recipe file name and a file extension.

For example, the form of the file name may be 0000@0000@0000, and the file extension may be xml.

In one embodiment, the measurement device 120 reads a recipe file line by line, to compose recipe information. As the composition of the recipe information is completed after the measurement device 120 reads the last line, the measurement device 120 may store the recipe.

In one embodiment, when failing to compose the recipe information, the measurement device 120 may transmit an error message that indicates that the composition of the recipe fails, through a path in which a recipe file is transmitted, and may record and store the reason of failure in a log file.

In one embodiment, the measurement device 120 may perform a filter optimization process, an aperture optimization process, a focus optimization process, a pinhole optimization process, and a selected option storage process in a consecutive order or in a different order, in the case where the composition of the recipe information is completed, and the information indicating that the execution of optimization of measure options of a wafer is included in the data received.

In one embodiment, the measurement device 120 may optimize measurement options of a recipe automatically, and this function is referred to as an auto recipe optimization function. At this time, optimization options may typically comprise a filter, the number of apertures (NA), a focus and a pinhole, and may additionally comprise various options later.

Accordingly, for the recipe, optimal options may be automatically stored through the ARO, only with wafer information, and position information on a measurement target.

With the help of the ARO program, various options may be automatically measured, selected and optimized, leading to a reduction in the man-hours of a worker. Further, optimization speed closely related to the ability of a worker may decrease constantly.

Figure 2:
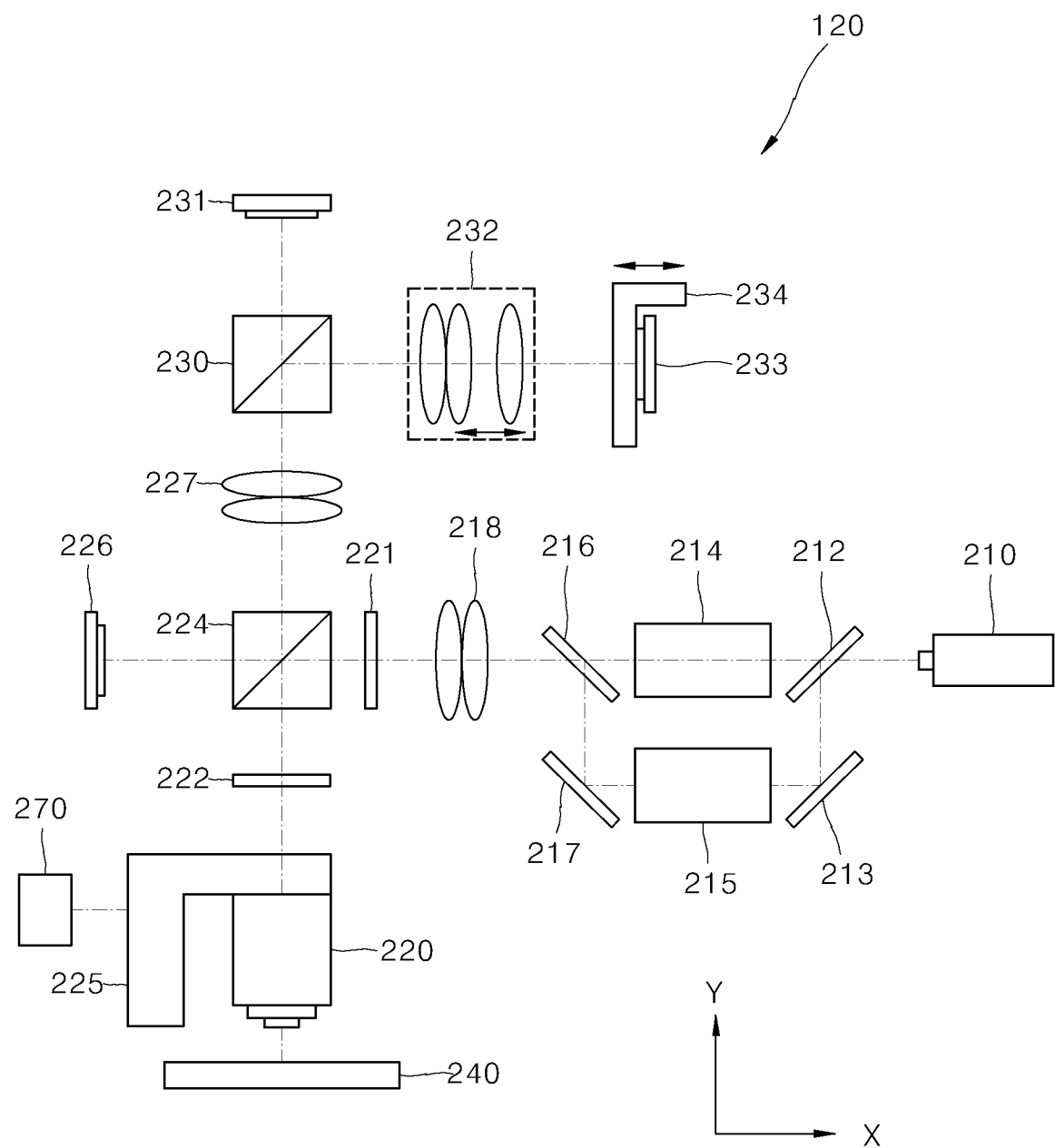
FIG. 2 is a conceptual view showing an overlay measurement device in one embodiment.

FIG. 2 is a conceptual view showing an overlay measurement device in one embodiment.

Referring to FIG. 2, the overlay measurement device 120 in one embodiment measures an error between a first overlay mark OM1 and a second overlay mark OM2 that are formed respectively in different layers formed in a wafer 240.

For example, the first overlay mark OM1 may be an overlay mark that is formed in a previous layer, and the second overlay mark OM2 is an overlay mark that is formed in a current layer. The overlay marks are formed in a scribe lane while forming a layer for forming a semiconductor device, in a die area. For example, the first overlay mark OM1 may be formed together with an insulation layer pattern, and the second overlay mark OM2 may be formed together with a photoresist pattern that is formed on the insulation layer pattern.

At this time, the first overlay mark OM1 is covered by the photoresist layer, while the second overlay mark OM2 is exposed outward, and the first overlay mark OM1 is made of an oxide having optical properties that differ from those of the second overlay mark OM2 comprised of a photoresist material. Additionally, the focal surface of the first overlay mark OM1 and the focal surface of the second overlay mark OM2 may be identical with each other or different from each other, depending on settings.

The overlay measurement device 120 in one embodiment may comprise a light source 210, a first beam splitter 212, a first mirror 213, a first spectrum filter (a color filter) 214, a second spectrum filter 215, a beam combiner 216, a second mirror 217, a relay lens 218, a polarizing filter 221, an aperture 251, a second detector 233, a focus actuator 234, a zoom lens 232, a first detector 231, a second beam splitter 230, an optical element 227, a third beam splitter 224, a lambda wave plate 222, an objective lens 220, a lens focus actuator 225, an aperture 251, an auto focus (AF) 261, and a processor 270.

The configuration of the overlay measurement device 120 illustrated in FIG. 2 is provided as an example, and components of the overlay measurement device 120 are not limited to those of the embodiment illustrated in FIG. 2, and when necessary, some components may be added, changed or removed. For example, the overlay measurement device 120 may comprise a memory (not illustrated) in which instructions, programs, logics and the like for enabling a processor 270 to control the operation of each component of the overlay measurement device 120 are stored.

In one embodiment, the light source 210 may comprise a halogen lamp, a xenon lamp, a supercontinuum laser, a light-emitting diode, a laser induced lamp and the like.

In one embodiment, the first beam splitter 212 splits a beam generated from the light source 210 into two beams. The first beam splitter 212 transmits some of the beam generated from the light source 210, and reflects some of the beam generate from the light source 210, to split the beam generated from the light source 210 into two beams.

In one embodiment, the first mirror 213 is disposed between the first beam splitter 212 and the second spectrum filter 215, and changes the path of the beam reflected by the first beam splitter 212 toward the second spectrum filter 215.

In one embodiment, the first spectrum filter 214 adjusts the central wavelength and bandwidth of the beam having passed through the first beam splitter 212, out of the beams split by the first beam splitter 212, such that the central wavelength and bandwidth may be appropriate to obtain the image of the second overlay mark OM2 formed in the current layer. The spectrum filter may comprise any one of a filter wheel, a linear translation device and a flipper device.

In one embodiment, the second spectrum filter 215 adjusts the central wavelength and bandwidth of the beam reflected by the first beam splitter 212, out of the beams split by the first beam splitter 212, such that the central wavelength and bandwidth may be appropriate to obtain the image of the first overlay mark OM1 formed in the previous layer. According to the present disclosure, the first spectrum filter and the second spectrum filter may be replaced with various types of filters. Additionally, the spectrum filter may comprise at least one of a filter wheel, a linear translation device and a flipper device.

In one embodiment, the beam combiner 216 combines the light having passed through the first spectrum filter 214 and the light having passed through the second spectrum filter 215. The light having passed through the first spectrum filter 214 passes through the beam combiner 216, and the beam having passed through the second spectrum filter 215 is reflected by the beam combiner 216 after its path is changed by the second mirror 217 toward the beam combiner 216 and is combined with the beam having passed through the beam combiner 216 again, and then passes through the aperture 251.

In one embodiment, the aperture 251 changes the beam having passed through the beam combiner such that the beam may be appropriate to photograph the first overlay mark 1.

In one embodiment, the second detector 233 detects the beam reflected by the second beam splitter 230. The second detector 233 is disposed at the focus actuator 234, and adjusts a distance between the second beam splitter 230 and the second detector 233. The second detector 233 obtains the image of the first overlay mark OM1.

In one embodiment, the first detector 231 detects the beam having passed through the second beam splitter 230. The first detector 231 obtains the image of the second overlay mark OM2.

Alternatively, the second detector may not operate, and the first detector only may obtain the images of the first overlay mark OM1 and the second overlay mark OM2, depending user settings.

In one embodiment, the zoom lens 232 is disposed between the second beam splitter 230 and the focus actuator 234. The zoom lens 232 receives a position change value of the second detector 233 from the focus actuator 234, and based on the position change value, matches the magnification of the image of the second overlay mark OM2 and the magnification of the image of the first overlay mark OM1. Since an optical path distance between the second detector 233 and the second beam splitter 230 differs from an optical path distance between the first detector 231 and the second beam splitter 230 depending on a difference in the heights of the first overlay mark OM1 and the second overlay mark OM2, the magnification of the image obtained by the first detector 231 and the magnification of the image obtained by the second detector 233 may differ. To measure an overlay error accurately, the magnifications need to be matched.

In one embodiment, the second beam splitter 230 splits the beam gathered by the objective lens 220 into two beams. The second beam splitter 230 may comprise a tube beam splitter and a dichroic filter. The dichroic filter transmits a beam of a specific wavelength. The beam gathered by the objective lens 220 is split into two beams by the second beam splitter 230 through a lambda wave plate 222, a third beam splitter 224 and an optical element 227. That is, the beam gathered by the objective lens 220 splits into a beam appropriate to detect the first overlay mark OM1 and a beam appropriate to detect the second overlay mark OM2.

In one embodiment, the optical element 227 may comprise a hot mirror and a cold mirror.

In one embodiment, the third beam splitter 224 splits the beam combined through the beam combiner 216 into two beams again. The beam combined through the beam combiner 216 is split into two beams by the third beam splitter 224, through a relay lens 218 and a polarizing filter 221, in a polarized state.

In one embodiment, the objective lens 220 concentrates the beam, being combiner by the combiner 216, being reflected by the third beam splitter 224 and then becoming one beam of polarized light through the lambda wave plate 222, on the measurement position of a wafer, and gathers a beam being reflected in the measurement position. The objective lens 220 is disposed at the lens focus actuator 225.

In one embodiment, the lens focus actuator 225 adjusts a distance between the objective lens 220 and a wafer 240 such that a focus surface may be placed at the first overlay mark OM1 or the second overlay mark OM2. The lens focus actuator 225 moves the objective lens 240 perpendicularly toward the wafer (e.g., in the Y direction), under the control of the processor 270, to adjust a focal length.

In one embodiment, the optical element is installed in a way that the optical element and the path of the beam having passed through the beam splitter form an angle of 45°, to send a beam to an auto focus module, and is characterized by reflecting a beam of a long wavelength, transmitting or reflecting a beam of a short wavelength, and transmitting a beam of a long wavelength. The optical element may be comprised of one of a hot mirror or a cold mirror.

In one embodiment, the auto focus module adjusts a focus, and generates a signal based on a distance between the objective lens and a wafer. That is, the auto focus module generates a signal based on a change in the position of a focus of the detector. The auto focus module may use an auto focus sensor module based on a phase difference. For example, in the case where a focus obtained by the auto focus sensor module is aligned with a 'standard focus', a phase difference value, which is a signal value output from the sensor, may be 0, and in the case where the focus is not aligned with the standard focus, the phase difference value may be a + value or a − value depending on the position of the focus. The 'standard focus' is the focus of the first or second detector, or the auto focus sensor, which is determined based on a signal of the sensor. The 'standard focus' may be aligned with a 'measurement focus' that is appropriate to obtain an actual alignment image, but in the case where there is a big difference in the heights of the first overlay mark OM1 and the second overlay mark OM2, may usually differ.

The auto focus sensor obtains a signal based on the position of a focus by using a reflected light reflected from the measurement area of a wafer, and to adjust the position of the focus, the actuator adjusting a distance between the measure area of the wafer and the objective lens is adjusted.

Figure 3:
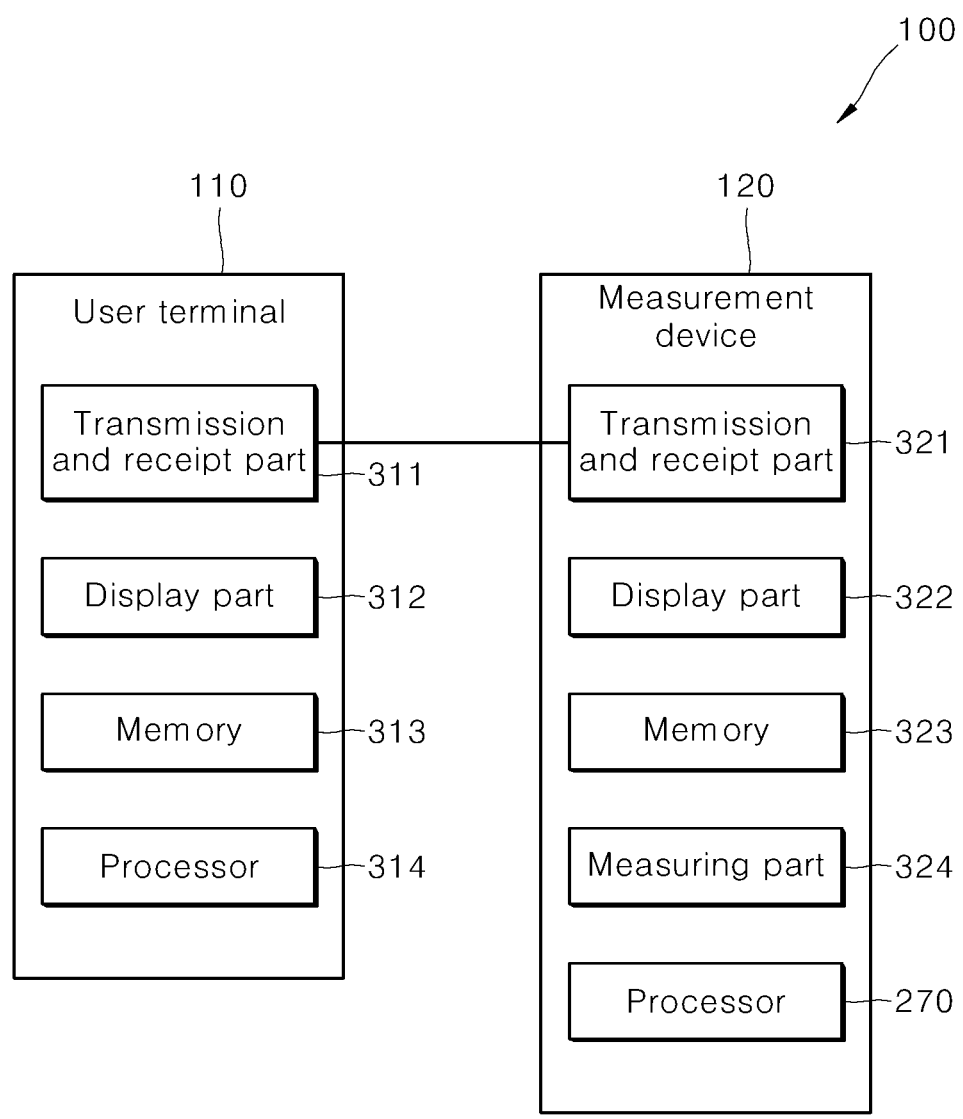
FIG. 3 is a block diagram showing the overlay measurement system in one embodiment.

FIG. 3 is a block diagram showing the overlay measurement system in one embodiment.

Referring to FIG. 3, the overlay measurement system 100 in one embodiment may comprise a user terminal 110 and a measurement device 120.

In one embodiment, the user terminal 110 may comprise a transmission and receipt part 311, a display part 312, a memory 313 and a processor 314.

For example, the transmission and receipt part 311 may transmit data or a signal to the measurement device 120 through a communication protocol (e.g., FTP).

For example, the display part 312 may display a manager program that receives a recipe setting value in relation to the measurement device from the user, under the control of the processor 314.

For example, the memory 313 may store an instruction or data in relation to at least one of other components of the user terminal 110. The memory 313 may store at least part of information on a recipe input from the user, instructions required to transmit unique information on the measurement device 120 to the measurement device 120, an algorithm, software and a program (e.g., an ARO manager program).

For example, the memory 313 may store instructions that execute functions to allow the measurement device 120 to perform optimization through the manager program installed in the user terminal 110.

For example, the processor 314 may link with at least one measurement device 120 though the transmission and receipt part 311, to transmit data comprising recipe information on the measurement device to the measurement device.

For example, the processor 314 may execute the manager program (e.g., an ARO manager program) that receives a setting value in relation to the recipe of at least one measurement device 120, and display the manager program on the display 312. The manager program may receive recipe information on the operation of a measurement device measuring the characteristics of a wafer from the user or from the transmission and receipt part 311.

For example, the processor 314 may generate data comprising information on input recipe, and unique information on a measurement device 120 (e.g., the IP address of a measurement device, the identifier of a measurement device, a password and the IP address of a server). For example, the processor 314 may generate data comprising information on a recipe in relation to each measurement device, and unique information of each measurement device respectively.

For example, the processor 314 may generate data comprising information indicating whether to optimize measurement options of a wafer by each measurement device.

For example, the processor 314 may transmit the generated data to a measurement device corresponding to the unique information. For example, the user terminal 110 may transmit data or a signal to one measurement device, or transmit data or a signal to each of the plurality of measurement devices at the same time.

Additionally, the processor 314 may generate data comprising information indicating whether to optimize measurement options of a wafer 240.

As described above, the processor 314 may generate a plurality of data comprising unique information of each of the plurality of measurement devices, and transmit the plurality of generated data to a corresponding measurement device at the same time.

In one embodiment, a measurement device 120 may comprise a transmission and receipt part 321, a display part 322, a memory 323, a measuring part 324 and a processor 270.

For example, the transmission and receipt part 321 may receive data or a signal from the user terminal 110 through a communication protocol (e.g., an FTP).

For example, the display part 322 may display information on a recipe received from the user terminal 110, through measurement software (e.g., an overlay application), under the control of the processor 270.

For example, the memory 323 may store an instruction or data in relation to at least one of other components of the measurement device 120. The memory 323 may store at least part of information on a recipe, instructions required to receive unique information on the measurement device 120 from the user terminal 110, an algorithm and software.

For example, the memory 323 may store a setting value in relation to the recipe received from the user terminal 110, a setting value preset in the measurement device 120, and data (e.g., optimized data in relation to options) generated based on the operation of the processor 270.

For example, the memory 323 may store instructions that execute functions, to allow the measurement device 120 to perform optimization through software installed in the measurement device 120.

For example, the measuring part 324 may measure the characteristics of a wafer 240, based on the recipe information set in the measurement device 120, under the control of the processor 270.

For example, the processor 270 may receive data comprising the recipe information on the measurement device from the user terminal 110, through the user terminal 110 and the transmission and receipt part 321.

For example, the processor 270 may display software that receives the setting value on the recipe of the measurement device 120, on the display part 322. Additionally, the processor 270 may display the information of the recipe in relation to the measurement device, received from the user terminal 110, through measurement software.

In one embodiment, the processor 270 may analyze the recipe included in the data that are received from the user terminal 110. For example, the recipe may comprise a value in relation of a plurality of parameters for measuring the characteristics of the wafer 240. Additionally, the recipe may comprise Final Residual 3 Sigma, Tis 3 Sigma, and at least one of Registration 3 Sigma, total measurement uncertainty (TMU) indicating measurement precision and move acquire measure (MAM) time indicating measurement time after movement between measurement and measurement, or total weight comprised of combinations thereof.

Additionally, data may comprise information indicating whether to optimize measurement options of the wafer 240.

In one embodiment, the processor 270 may determine whether a recipe file is verified, with at least one of the form of a recipe file name and a file extension included in the data that are received from the user terminal 110. For example, the form of the file name may be 0000@0000@0000, and the file extension may be xml.

In one embodiment, the processor 270 may optimize measurements options of a wafer, based on the recipe, as the analysis of the recipe is completed. For example, the processor 270 reads the recipe file line by line, to compose recipe information. As the composition of the recipe information is completed after the processor 270 reads the last line, the measurement device 120 may store the recipe in the memory 323.

In one embodiment, the processor 270 may measure one or more filters (e.g., spectrum filters) in the measurement device 120 once to calculate statistical values in relation to a plurality of parameters for each filter. Alternatively, the processor 270 may measure one or more filters (e.g., spectrum filters) in the measurement device 120 at least once. A minimum number of the above-described measurement is one. The processor 270 may apply weight respectively to the calculated statistical values, and perform a filter optimization process of selecting a filter where a total of the statistical values to which the weight is applied respectively is a minimum value.

For example, the processor 270 may measure an overlay measurement value, i.e., Tis 3 Sigma and Registration 3 Sigma, in relation to each filter, and model the measured Tis 3 Sigma and Registration 3 Sigma to obtain Final Residual 3 Sigma.

Additionally, the processor 270 may obtain Final Residual 3 Sigma, Tis 3 Sigma, and at least one of Registration 3 Sigma, total measurement uncertainty (TMU) indicating measurement precision and move acquire measure (MAM) time indicating measurement time after movement between measurement and measurement, or total weight comprised of combinations thereof.

Then the processor 270 may apply weigh respectively to the statistical value of at least one parameter of each filter, and select a filter where a total of a resultant value to which weight is applied is a minimum value.

In one embodiment, the processor 270 may measure one or more apertures in the measurement device 120 once to calculate statistical values of a plurality of parameters in relation to each aperture. Additionally, the processor 270 may apply weight respectively to the calculated statistical values, and perform an aperture optimization process of selecting an aperture (a numerical aperture (na)) where a total of the statistical values to which weight is applied respectively is a minimum value. An aperture may use a single identical lens, and the number of the openings of the aperture may change. Accordingly, the aperture may change the amount and shape of light.

For example, the processor 270 may obtain an overlay measurement value, i.e., Tis 3 Sigma and Registration 3 Sigma, in relation to each aperture, and model the measured Tis 3 Sigma and Registration 3 Sigma to obtain final Residual 3 Sigma.

Additionally, the processor 270 may obtain Final Residual 3 Sigma, Tis 3 Sigma, and at least one of Registration 3 Sigma, TMU and MAM time, or total weight comprised of combinations thereof.

Then the processor 270 may apply weigh respectively to the statistical value of each parameter of each aperture, and select an aperture where a total of a resultant value to which weight is applied is a minimum value.

In one embodiment, the processor 270 may perform a focus scan on one site in the measurement device 120 to determine a focus measurement area, and move a focus step by step in the determined measurement area on each site to calculate statistical values in relation to the plurality of parameters. Additionally, the processor 270 may apply weight respectively to the calculated statistical values, and perform a focus optimization process of selecting a focus where a total of the statistical values to which weight is applied respectively is a minimum value.

For example, the processor 270 may measure an overlay measurement value, i.e., Tis 3 Sigma and Registration 3 Sigma, in relation to each focus, and model the measured Tis 3 Sigma and Registration 3 Sigma to obtain Final Residual 3 Sigma.

Additionally, the processor 270 may apply weight to the statistical value of each parameter of each focus and select a focus where a total of a resultant value to which weight is applied is a minimum value.

In one embodiment, the processor 270 may measure an aperture in a first pinhole position of the measurement device 120 once, and measure the aperture in a second pinhole position that is a predetermined distance (e.g., 3 μm) apart from the first pinhole position once. Additionally, the processor 270 may calculate Tis 3 Sigma in the first pinhole position and the second pinhole position, and model the Tis 3 Sigma in each pinhole position in relation to the aperture. Further, the processor 270 may perform a pinhole optimization process of selecting a pinhole position where the Tis 3 Sigma is a minimum.

In one embodiment, the processor 270 may store information (e.g., a resultant value of optimization) on options that are selected in each of the above-described filter optimization process, aperture optimization process, focus optimization process and pinhole optimization process in the memory 323.

In one embodiment, the processor 270 may obtain data for controlling the operation of the overlay measurement device 120 from the user terminal 110 through the transmission and receipt part 321, and based on the obtained data, control the operation of the overlay measurement device 120.

For example, the processor 270 may analyze the obtained data, to extract information of a recipe input to allow the overlay measurement device 120 to measure the characteristics of a wafer and unique information of the overlay measurement device 120. Additionally, the processor 270 may control the operation of the overlay measurement device 120 entirely, based on the extracted information.

Figure 4:
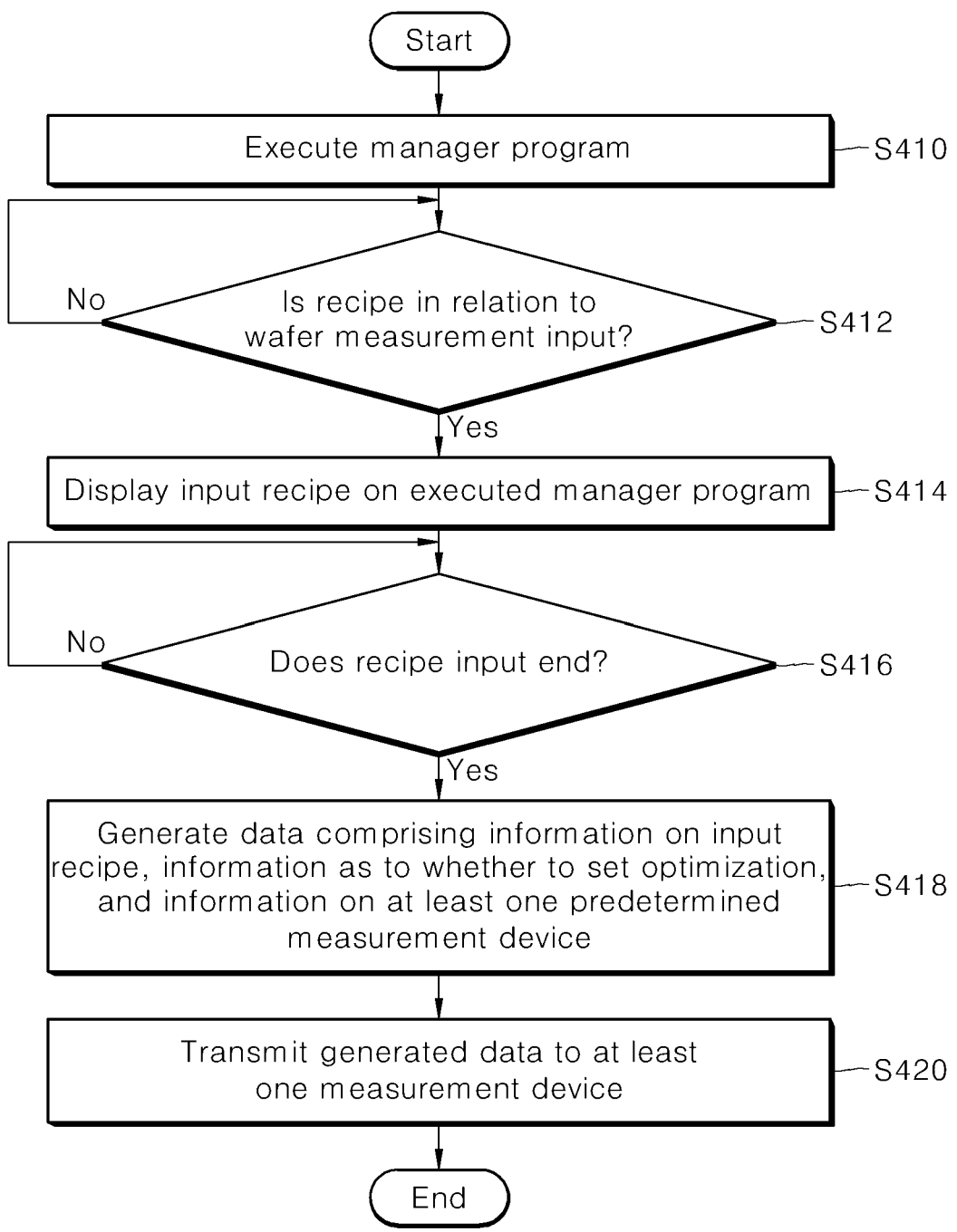
FIG. 4 is a flowchart showing a process in which a user terminal transmits data to the measurement device in one embodiment.
Figure 5:
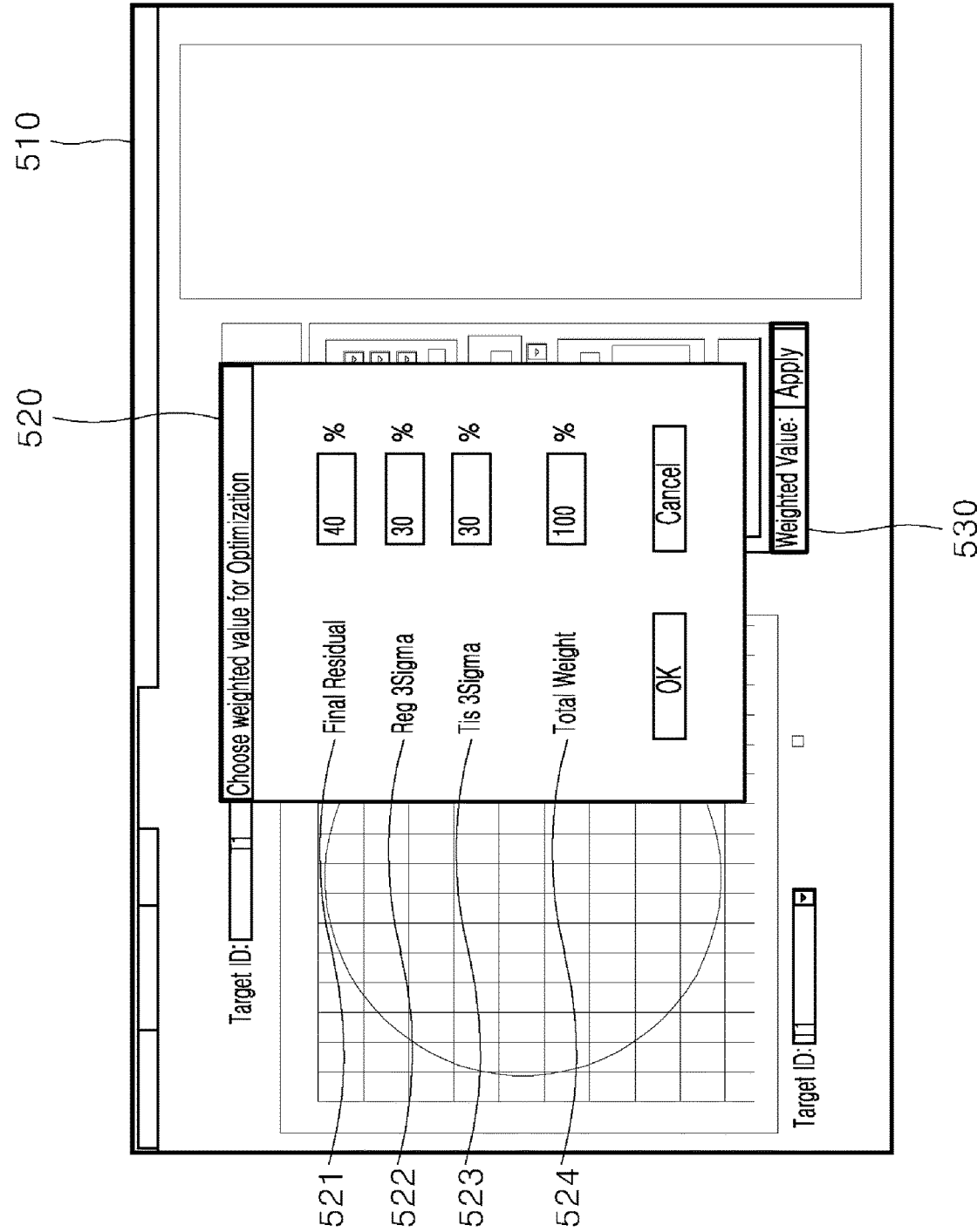
FIG. 5 is an exemplary view showing that information on a plurality of parameters is input to a manager program in one embodiment.

FIG. 4 is a flowchart showing a process in which a user terminal transmits data to the measurement device in one embodiment. FIG. 5 is an exemplary view showing that information on a plurality of parameters is input to a manager program in one embodiment.

Hereafter, the process in which the user terminal transmits data to the measurement device in one embodiment is described with reference to FIGS. 3 to 5.

In one embodiment, the processor 314 may execute a manager program (S410). The processor 314 may display the manager program that manages and controls the measurement device remotely, on the display part 312, after executing the manager program (e.g., an ARO manger program). The manager program may receive recipe information on the operation of the measurement device measuring the characteristics of a wafer from the user, or obtain the recipe information through the transmission and receipt part 311.

In one embodiment, the processor 314 identify whether a recipe in relation to wafer measurement is input (S412). The manager program may receive a value in relation to a plurality of parameters for measuring the characteristics of a wafer from the user. For example, the plurality of parameters may comprise Final Residual 3 Sigma, Tis 3 Sigma and Registration 3 Sigma. Additionally, the plurality of parameters may comprise total weight comprised of combinations at least one or more parameters.

Further, the manager program may receive Final Residual 3 Sigma, Tis 3 Sigma, and at least one of Registration 3 Sigma, total measurement uncertainty (TMU) indicating measurement precision and move acquire measure (MAM) time indicating measurement time after movement between measurement and measurement, or total weight comprised of combinations thereof.

In one embodiment, the processor 314 may display the input recipe on the executed manager program (S414). The processor 314 may display a value (e.g., a ratio) that is input from the user in relation to each of the plurality of parameters, in real time, on the manager program.

Referring to FIG. 5, the manager program (e.g., an ARO manager program) 510 may display a pop up 520 for receiving a value in relation to the plurality of parameters from the user. For example, the pop up 520 may receive a ratio of Final Residual 3 Sigma 521, a ratio of Tis 3 Sigma 521, and a ratio of Registration 3 Sigma 521. Further, the pop up 520 may receive a ratio in relation to at least one or more of parameters.

For example, as the ratio of Final Residual 3 Sigma 521, the ratio of Tis 3 Sigma 521, and the ratio of Registration 3 Sigma 521 are all input, a total weight value may be displayed. As the user clicks a weight value application button 530, the processor 314 may generate data comprising information on the input parameters and unique information of the measurement device.

In one embodiment, the processor 314 may identify whether a recipe input finishes (S416). The processor 314 may identify whether each ratio of Final Residual 3 Sigma, Tis 3 Sigma, and Registration 3 Sigma are input.

Additionally, the processor 314 may identify whether unique information on at least one measurement device, to which a recipe input in relation to a plurality of parameters is applied, is input. For example, the unique information may comprise the IP address of the measurement deice, the identifier of the measurement device, a password and the IP address of a server).

Further, the processor 314 may identify whether information indicating whether the optimization of measurement options of a wafer in relation to each measurement device is performed is input.

In one embodiment, the processor 314 may generate data comprising information on the input recipe, and prestored information on at least one measurement device (S418). The processor 314 may respectively generate data comprising information on a recipe in relation to each measurement device, and unique information on the measurement device.

Further, the processor 314 may generate data comprising information indicating whether to optimize measurement options of a wafer in relation to each measurement device.

In one embodiment, the data may comprise information of a recipe input to allow the overlay measurement device 120 to measure the characteristics of a wafer through the manager program installed in the user terminal 110, and unique information of the overlay measurement device 120.

The data may comprise at least part of first information on the configuration of a wafer map, second information on at least one measurement option in relation to the wafer, third information on at least one additional option in relation to the wafer and fourth information indicating whether to optimize the measurement options of the wafer.

For example, the first information may comprise at least part of the diameter of the wafer, the X-distance and the Y-distance of a field, the central coordinate of the field, information on whether to use a field that cannot be completely in the wafer, and a thickness that is not to be measured at the end of the wafer.

For example, the second information may comprise at least part of information of settings in relation to target measurement, information on optical settings at a time of measurement, and information of algorithm settings used for measurement.

For example, the third information may comprise at least part of information on a selection of a measurement mode, information as to whether to use an image storage function, information as to whether to use an auto data file storage function, information as to whether to use a manual assist function, information on conditions for performance of an auto pinhole optimization function, information as to whether to use an auto wafer center calibration function, and information as to whether to use a target finder function. For example, the manual assist function is a manual manipulation one of searching a target, which is performed directly by the operator. For example, the target finder function involves searching the center of an overlay target.

For example, the fourth information may comprise at least part of information on a filter optimization process, information on an aperture optimization process, information on a focus optimization process, and information on a pinhole optimization process.

The information on a filter optimization process may comprise at least part of information indicating whether to use a filter optimization function, and information on a list of filters to be measured at a time of using the filter optimization function.

The information on an aperture optimization process may comprise at least part of information indicating whether to use an aperture optimization function, and information on a list of apertures to be measured at a time of using the aperture optimization function.

The information on a focus optimization process may comprise at least part of information indicating whether to use a focus optimization function, information on a focus template mode to be used during the focus optimization process, information on an input file path based on the use of the focus optimization function, information on a method selected to obtain a focus, information as to whether to store a focus selected after optimization, and information indicating a range of focuses.

Further, the information on a pinhole optimization process may comprise information as to whether to use a pinhole optimization function.

In one embodiment, the processor 314 may transmit the generated data to at least one measurement device (S420). The processor 314 may transmit the generated data to a measurement device corresponding to unique information through the transmission and receipt part (311). For example, the processor 314 may transmit data or a signal to one measurement device, or transmit data or a signal each of the plurality of measurement devices at the same time.

The processor 314, as described above, may respectively generate a plurality of data comprising unique information of each of the plurality of measurement devices, and simultaneously transmit the plurality of data generated respectively to a corresponding measurement device through the transmission and receipt part 311.

Figure 6:
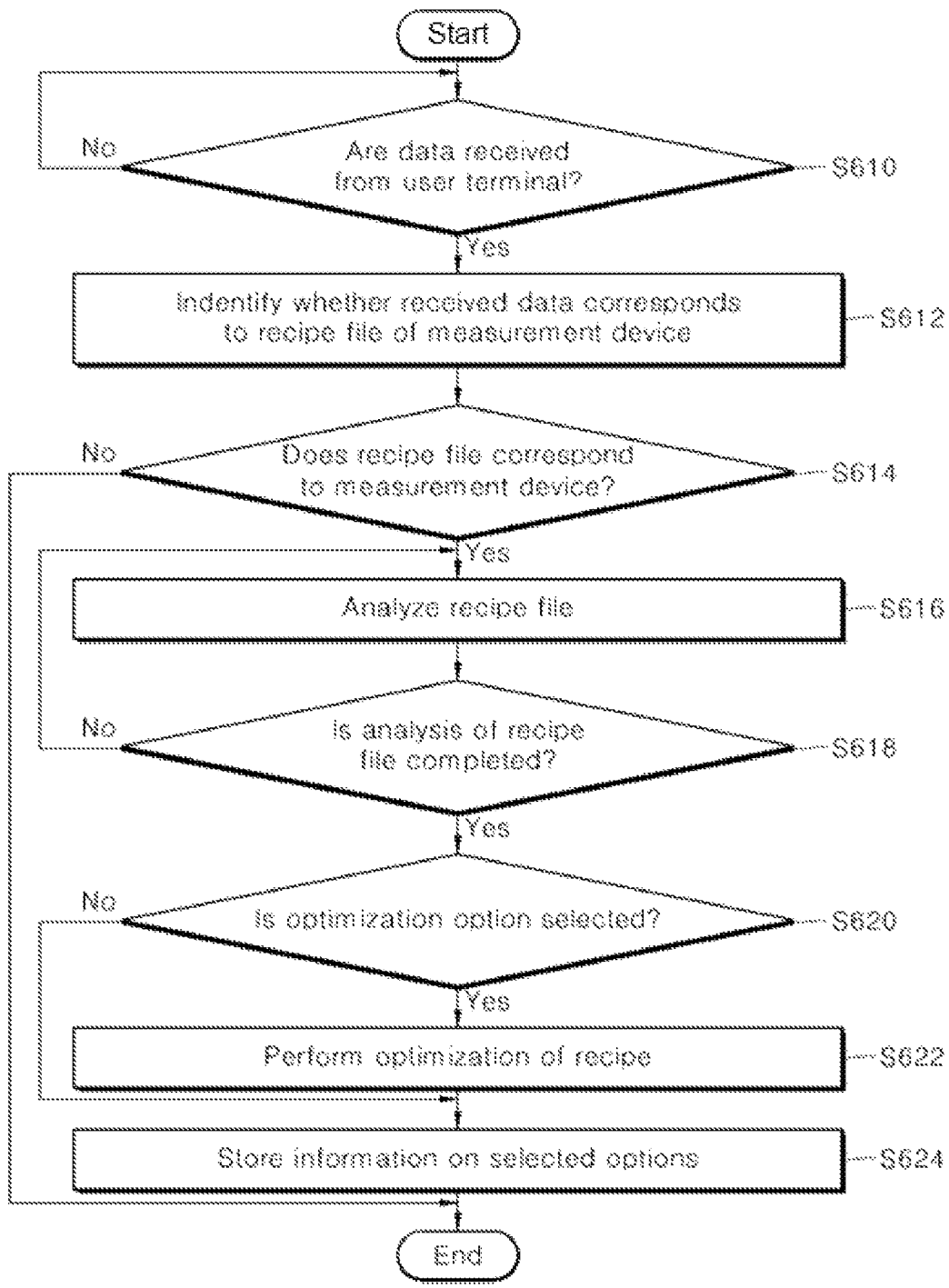
FIG. 6 is a flowchart showing a process in which the measurement device performs optimization, based a recipe file, in one embodiment.
Figure 7:
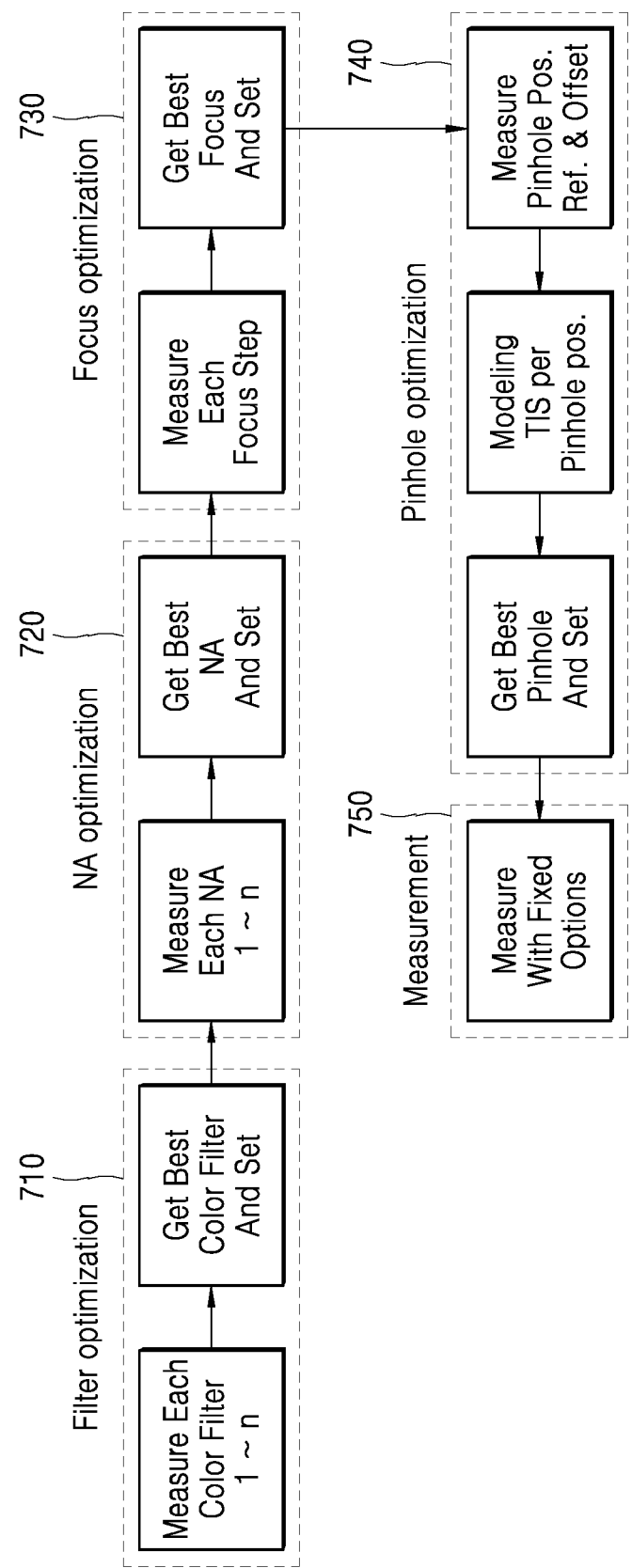
FIG. 7 is an exemplary view showing a state in which the measurement device performs optimization, based on a recipe file, in one embodiment.

FIG. 6 is a flowchart showing a process in which the measurement device performs optimization, based a recipe file, in one embodiment. FIG. 7 is an exemplary view showing a state in which the measurement device performs optimization, based on a recipe file, in one embodiment.

Hereafter, the process in which the measurement device in one embodiment performs optimization based on a recipe file is described as follows with reference to FIGS. 3, 6 and 7.

In one embodiment, the measurement device 120 (e.g., the processor 270) may identify where data is received from the user terminal 110 (S610). The measurement device 120 (e.g., the processor 270) may continue to check a path in which a recipe file is received from the user terminal 110, with a thread, in the state where measurement software is executed, to identify whether data is received from the user terminal 110.

For example, the data may comprise information on a recipe that is input by the user through the manger program, and unique information on a measurement device. Additionally, the data may comprise information indicating whether the process of optimizing measurement options of a wafer is performed.

In one embodiment, the measurement device 120 (e.g., the processor 270) may identify whether received data correspond to a recipe file of a measurement device (S612). When receiving the recipe file through the transmission and receipt part 321, the measurement device 120 (e.g., the processor 270) may check whether the recipe file is the recipe file in relation to a corresponding measurement device, by using at least one of the form of a recipe file name and a file extension. For example, the form of a name may be 0000@0000@0000, and the extension may be xml. In the present disclosure, the form of a name is not limited to a specific form, and the extension is not limited to a specific extension.

In one embodiment, the measurement device 120 (e.g., the processor 270) may analyze the recipe file (S614, S616), when the recipe file corresponds to the measurement device. The measurement device 120 (e.g., the processor 270) may read the received recipe file line by line to configure recipe information.

For example, the measurement device (e.g., the processor 270) may analyze the recipe included in the data that are received from the user terminal 110. For example, the measurement device 120 (e.g., the processor 270) may analyze a value in relation to a plurality of parameters for measuring the characteristics of a wafer 240. For example, the plurality of parameters may comprise a ratio of Final Residual 3 Sigma, a ratio of Tis 3 Sigma, a ratio of Registration 3 Sigma, a ratio of total weight, TMU and MAM time.

In one embodiment, the measurement device 120 (e.g., the processor 270) may identify where the analysis of a recipe file is completed (S618). After reading the last line of the recipe file and completing the composition of recipe information, the measurement device 120 (e.g., the processor 270) may store the recipe in the memory 323.

In one embodiment, the measurement device 120 (e.g., the processor 270) may identify whether an optimization option is selected (S620). The measurement device 120 (e.g., the processor 270) may identify whether information indicating the optimization option is included in the data that are received in step 610 (S610). The information on an optimization option may be input by the user through the manager application of the user terminal 110.

In one embodiment, the measurement device 120 (e.g., the processor 270) may perform optimization of the recipe (S622). The measurement device 120 (e.g., the processor 270) may one or more filters (e.g., spectrum filters) therein once to calculate statistical values of a plurality of parameters in relation to each filter. Additionally, the processor 270 may apply weight to the calculated statistical values respectively, and perform a filter optimization process of selecting a filter where a total of the statistical values to which weight is applied respectively is a minimum value.

Additionally, the measurement device 120 (e.g., the processor 270) may measure an overlay measurement value, i.e., Tis 3 Sigma and Registration 3 Sigma, in relation to each filter, and model the measured Tis 3 Sigma and Registration 3 Sigma to obtain Final Residual 3 Sigma.

Further, the measurement device 120 (e.g., the processor 270) may apply weight to the statistical value of each parameter of each filter and select a filter where a total of resultant values to which weight is applied is a minimum.

Referring to FIG. 7, the measurement device 120 (e.g., the processor 270) may calculate statistical values of a plurality of parameters in relation to each of the spectrum filters (1~n), apply weight the calculated statistical values respectively, and perform a filter optimization process (710) of selecting a filter where a total of the statistical values to which weight is applied respectively is a minimum value.

In one embodiment, the measurement device 120 (e.g., the processor 270) may measure one or more apertures therein once to calculate statistical values of a plurality of parameters in relation to each aperture. Additionally, the measurement device 120 (e.g., the processor 270) may apply weight to the calculated statistical values respectively, and perform an aperture optimization process of selecting an aperture where a total of the statistical values to which weight is applied respectively is a minimum. The aperture may use a single identical lens, and the number of the openings of the aperture may change. Accordingly, the aperture may change the amount and shape of light.

Further, the measurement device 120 (e.g., the processor 270) may measure an overlay measurement value, i.e., Tis 3 Sigma and Registration 3 Sigma, in relation to each aperture, and model the measured Tis 3 Sigma and Registration 3 Sigma to obtain Final Residual 3 Sigma.

Further, the measurement device 120 (e.g., the processor 270) may respectively apply weight to the statistical value of each parameter of each aperture and select an aperture where a total of resultant values to which weight is applied is a minimum.

Referring to FIG. 7, the measurement device 120 (e.g., the processor 270) may calculate the statistical value of a plurality of parameters in relation to each of the apertures (1~n), apply weight to the calculated statistical values respectively, and perform an aperture optimization process (720) of selecting an aperture where a total of the statistical values to which weight is applied respectively is a minimum.

In one embodiment, the measurement device 120 (e.g., the processor 270) may perform a focus scan on one site in the measurement device 120 to determine a focus measurement area, and move a focus step by step in the determined measurement area on each site to calculate statistical values in relation to the plurality of parameters. Additionally, the measurement device 120 (e.g., the processor 270) may respectively apply weight to the calculated statistical values, and perform a focus optimization process of selecting a focus where a total of the statistical values to which weight is applied respectively is a minimum.

For example, the measurement device 120 (e.g., the processor 270) may measure an overlay measurement value, i.e., Tis 3 Sigma and Registration 3 Sigma, in relation to each focus, and model the measured Tis 3 Sigma and Registration 3 Sigma to obtain Final Residual 3 Sigma.

Further, the measurement device 120 (e.g., the processor 270) may respectively apply weight to the statistical value of each parameter of each focus, and select a focus where a total of resultant values to which weight is applied is a minimum.

Referring to FIG. 7, the measurement device 120 (e.g., the processor 270) may measure Tis 3 Sigma and Registration 3 Sigma, in relation to each focus, model the measured Tis 3 Sigma and Registration 3 Sigma, and perform a focus optimization process (730) of obtaining Final Residual 3 Sigma.

In one embodiment, the measurement device 120 (e.g., the processor 270) may measure an aperture in a first pinhole position of the measurement device 120 once, and measure the aperture in a second pinhole position that is a predetermined distance (e.g., 3 μm) apart from the first pinhole position once. Additionally, the measurement device 120 (e.g., the processor 270) may calculate Tis 3 Sigma in the first pinhole position and the second pinhole position, and model the Tis 3 Sigma in each pinhole position in relation to the aperture. Further, the measurement device 120 (e.g., the processor 270) may perform a pinhole optimization process of selecting a pinhole position where the Tis 3 Sigma is a minimum.

Referring to FIG. 7, the measurement device 120 (e.g., the processor 270) may calculate Tis 3 Sigma in the first pinhole position and the second pinhole position, model the Tis 3 Sigma in each pinhole position in relation to the aperture, and perform a pinhole optimization process (740) of selecting a pinhole position where the Tis 3 Sigma is a minimum.

In one embodiment, the measurement device 120 (e.g., the processor 270) may store information on selected options (S624). The measurement device 120 (e.g., the processor 270) may store information (e.g., a resultant value of optimization) on options selected in each of the filter optimization process, the aperture optimization process, the focus optimization process and the pinhole optimization process, in the memory 323, as the last optimization process is performed.

Referring to FIG. 7, the measurement device 120 (e.g., the processor 270) may store the information (e.g., a resultant value of optimization) on options selected in each of the above-described filter optimization process, aperture optimization process, focus optimization process and pinhole optimization process, in the memory 323. Additionally, the measurement device 120 (e.g., the processor 270) may control the measuring part 324, and based on the selected options, measure the characteristics of a wafer 240.

Figure 8:
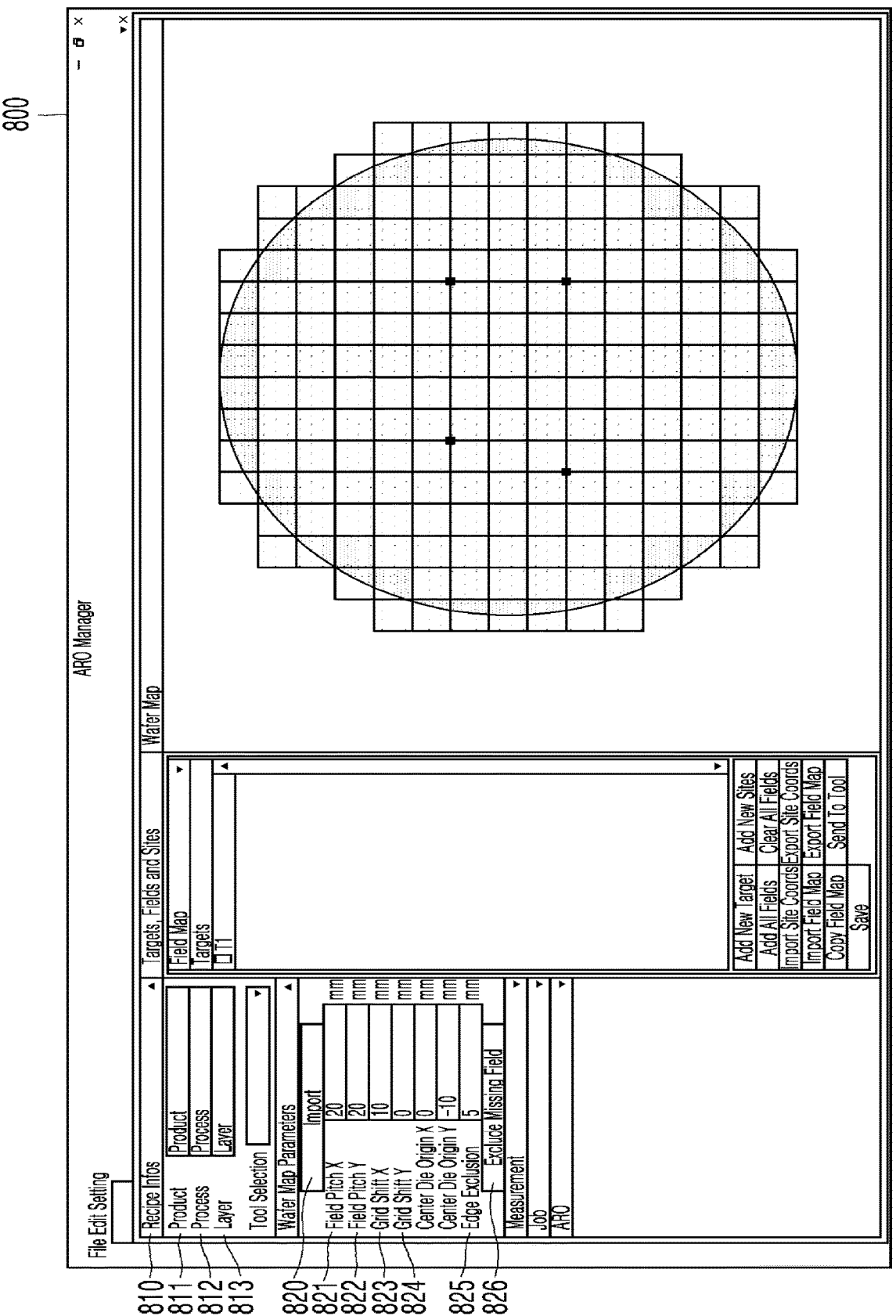
FIG. 8 is a first exemplary view showing the screen of the manager program to which information on a recipe of the measurement device 120 is input, in one embodiment.

FIG. 8 is a first exemplary view showing the screen of the manager program to which information on a recipe of the measurement device 120 is input, in one embodiment.

As illustrated in FIG. 8, the manager program may display a screen 800 for receiving information on the configuration of a wafer map.

In one embodiment, the user may input recipe information 810 to be generated, and information 820 on a wafer map parameter to the screen 800 of the manager program.

For example, the recipe information 810 to be generated may comprise information on a product name 811 (e.g., a product), and information on a process 812 and a layer 813.

For example, the information 820 on a wafer map parameter may comprise information on a X-distance 821 (e.g., 20 mm) of a field, a Y-distance 822 (e.g., 20 mm) of a field, the central coordinate (823, 824) (e.g., 10 mm, 0 mm) of a field that is (0, 0) when a wafer is divided by a field distance to generate a coordinate, a thickness 825 (e.g., 5 mm) that is not to be measured at the end of a wafer, and information 826 indicating whether to use a field that cannot be completely in a wafer for measurement.

As described above, the information on the configuration of a wafer map may comprise at least part of the diameter of a wafer, the X-distance and the Y-distance of a field, the central coordinate of the field, information as to whether to use a field that cannot be completely in a wafer, a thickness that is not to be measured at the end of the wafer, and additional information that is delivered later.

Figure 9:
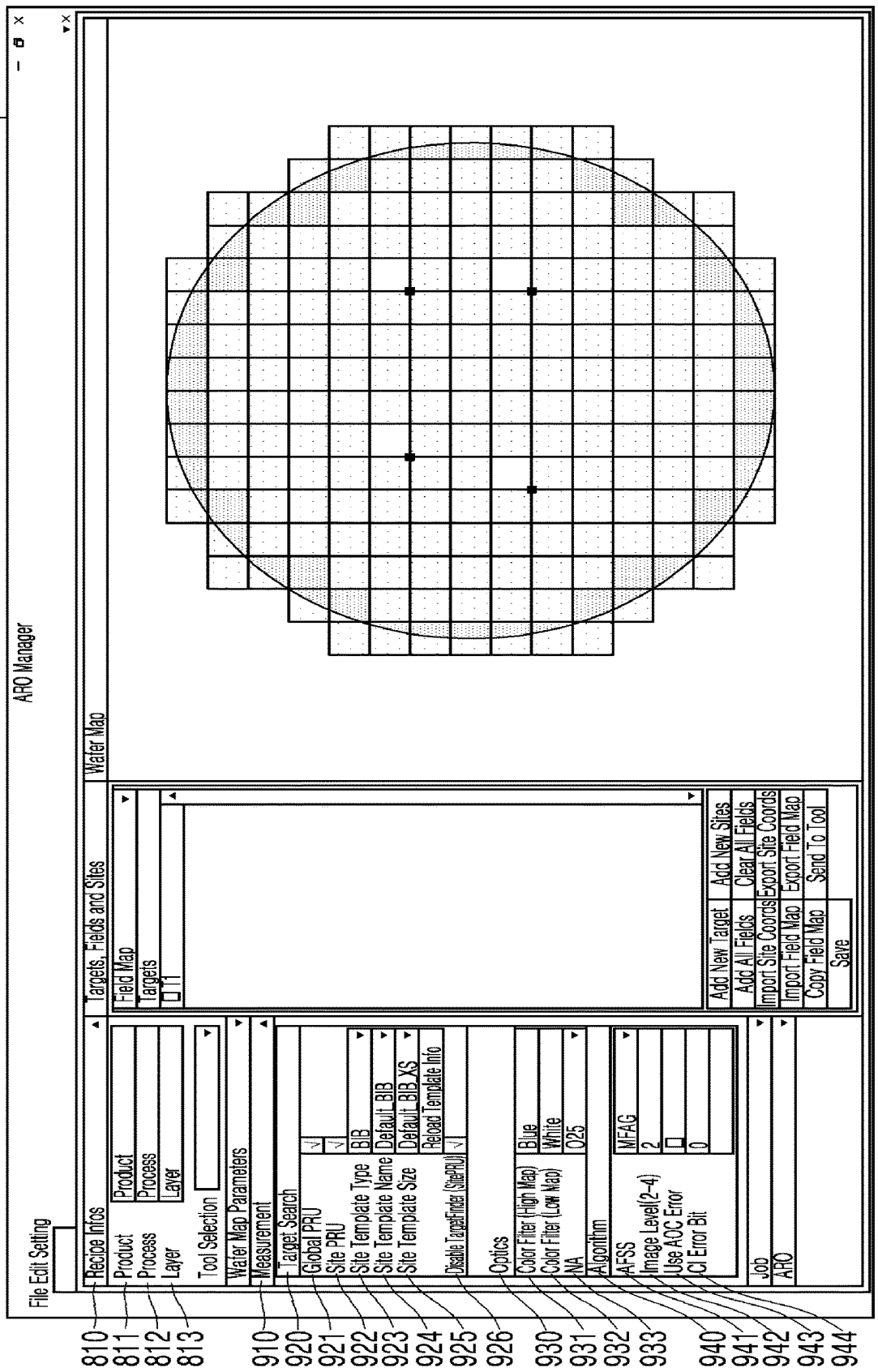
FIG. 9 is a second exemplary view showing the screen of the manager program to which information on a recipe of the measurement device 120 is input, in one embodiment.

FIG. 9 is a second exemplary view showing the screen of the manager program to which information on a recipe of the measurement device 120 is input by the user, in one embodiment.

As illustrated in FIG. 9, the manager program may display a screen 900 for receiving at least one measurement option in relation to a wafer.

In one embodiment, the user may input information 920 on a target search, information 930 on an optical option, and information 940 on an algorithm to the screen 900 of the manager program.

For example, the information 920 on a target search may comprise information 921 as to whether to use a function of automatically searching a target during optimization without registering a global pattern recognition (PR) image in a recipe at a time of optimizing the recipe, information 922 as to whether to use a function of automatically searching a target during optimization without registering a site PR image in a recipe at a time of optimizing the recipe, information 923 (e.g., BIB) on the type of a site template, information 924 (e.g., Default_BIB) on the name of a site template, information 925 (e.g., Default_BIB_XS) on the size of a site template, and information 926 as to whether to use a target finder function at a time of using a function of automatically searching a site PR.

For example, the information 930 on optical options may comprise information 931 on a basic color filter used at a time of high-magnification lens observation (e.g., Type: a color (e.g., blue) filter type applied to equipment, Name: a color filter name), information 932 on a basic color filter used at a time of low-magnification lens observation (e.g., Type: a color (e.g., white) filter type applied to equipment, Name: a color filter name), and information 933 on the size and shape of a caliber used at a time of measurement (e.g., 025).

For example, the information 940 on an algorithm may comprise information on the type 941 (e.g., the name of an AFSS mode, the name of an algorithm) and level 942 (a value needed at a time of calculation of an AFSS algorithm) of an advanced frame sampling strategy (AFSS) mode used at a time of measurement, information 943 as to whether to display an accurate overlay control (AOC) error (e.g., an error is applied to a corresponding site in the case where a measured contrast index (CI) value is less than an input value at a time of recipe measurement). For example, the AFSS mode involves increasing the number of measurement frames to reduce the noise of an image.

As described above, the information on at least one measurement option in relation to a wafer may comprise at least part of information of settings in relation to target measurement, information on optical settings at a time of measurement, and information of algorithm settings used at a time of measurement.

Figure 10:
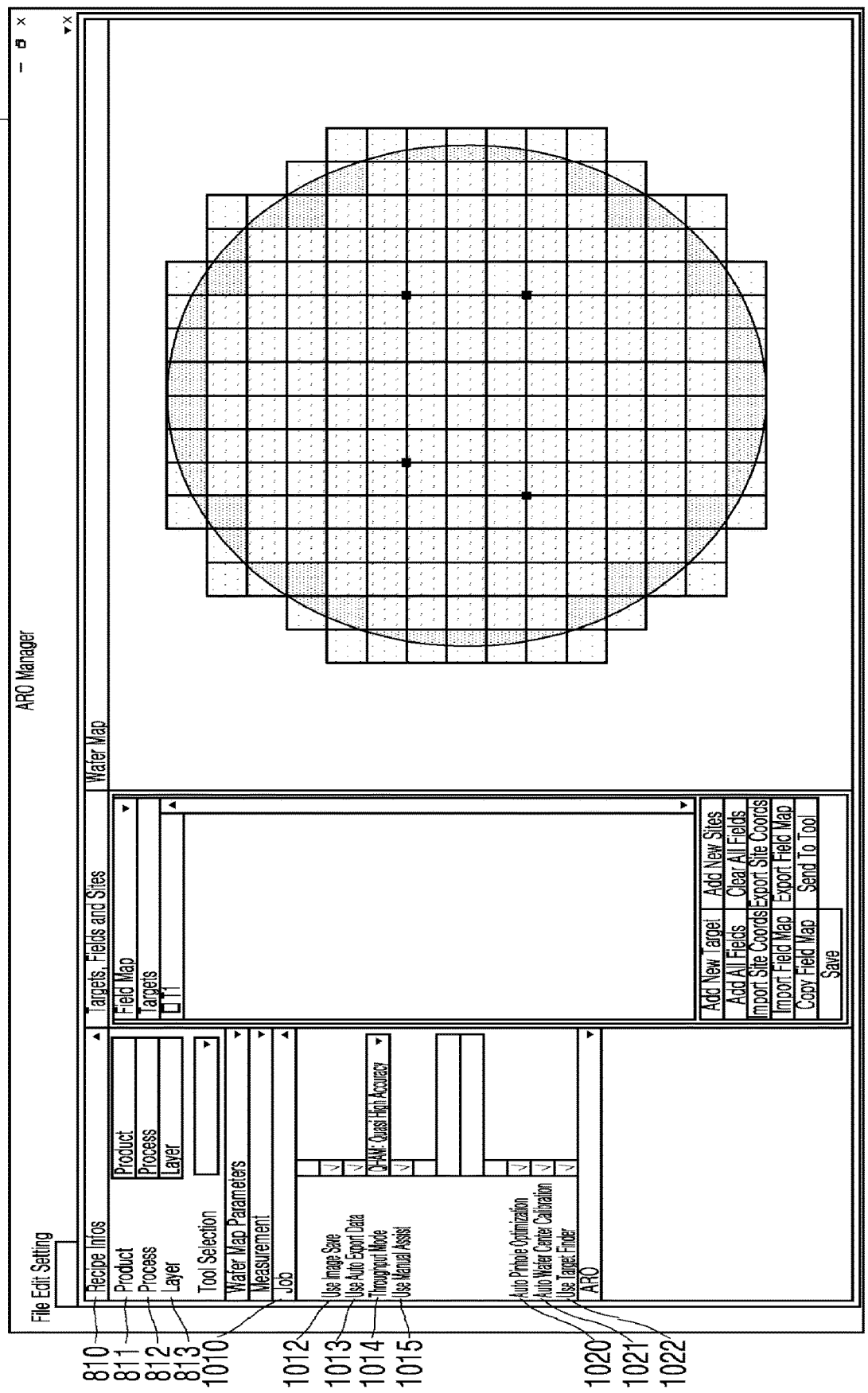
FIG. 10 is a third exemplary view showing the screen of the manager program to which information on a recipe of the measurement device 120 is input, in one embodiment.

FIG. 10 is a third exemplary view showing the screen of the manager program to which information on a recipe of the measurement device 120 is input from the user, in one embodiment.

As illustrated in FIG. 10, the manager program may display a screen 1000 for receiving at least one additional option in relation to a wafer.

For example, information as to whether to use an image storing function 1012, whether to use an auto data file storage function 1013, whether a measurement mode (e.g., a throughput mode) is used/whether to use a measurement mode 1014 (e.g., a throughput Mode), whether a manual assist is used/whether to use a manual assist 1015, whether automatic pinhole optimization is used/whether to use automatic pinhole optimization 1020 (e.g., automatic pinhole optimization can be set at a time of placing a job on a queue), and whether an auto wafer center calibration is used/whether to use an auto wafer center calibration (1021), and whether a target finder is used/whether to use a target finder 1022.

For example, the information on at least one of additional options in relation to the wafer may comprise at least part of information on a selection of a measurement mode, information as to whether to use an image storage function, information as to whether to use a data output function, information as to whether to use a manual assist function, information on conditions for performance of an auto pinhole optimization function, information as to whether to use an auto wafer center calibration function, and information as to whether to use a target finder function. For example, the auto wafer center calibration function involves searching a wafer center automatically as a wafer is loaded.

Figure 11:
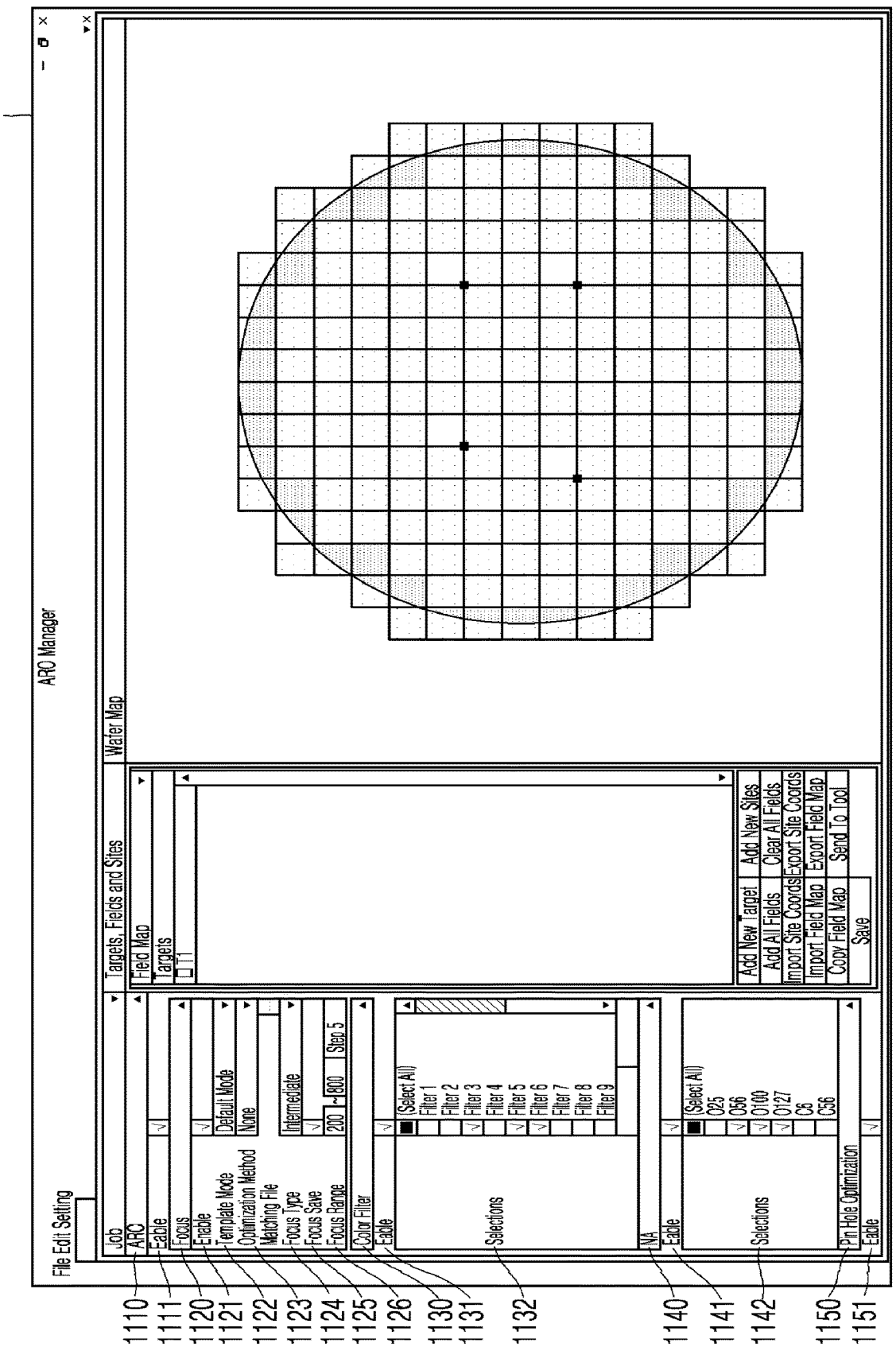
FIG. 11 is a fourth exemplary view showing the screen of the manager program to which information on a recipe of the measurement device 120 is input, in one embodiment.

FIG. 11 is a fourth exemplary view showing the screen of the manager program to which information on a recipe of the measurement device 120 is input, in one embodiment.

As illustrated in FIG. 11, the manager program may display a screen 1100 to which information as to whether to perform the optimization of measurement options of a wafer is input from the user.

In one embodiment, information 1110 as to whether to use an optimization process, information 1120 on a focus optimization process, information 1130 on a filter optimization process, information 1140 on an aperture optimization process, and information 1150 on a pinhole optimization may be input to the screen 1100 of the manager program.

For example, the information 1110 as to whether to use an optimization process indicates whether to perform the optimization of measurement options in relation to a wafer 1111.

For example, the information 1120 on a focus optimization process may comprise information 1121 as to whether to use a focus function during optimization, information 1122 on a focus template mode (e.g., a default mode) to be used during optimization, information 1123 as to whether to use a focus optimization function and information on an input file path needed at a time of use of a specific function, and information 1124 on a focus type (e.g., intermediate), and after optimization, information 1125 as to whether to store a selected focus, and information 1126 on a scan range used for a focus scan (e.g., 200-800 step 5).

As described above, the information on a focus optimization process may comprise at least part of information as to whether to use a focus optimization function, information on a focus template mode to be used during the focus optimization process, information on an input file path based on the use of the focus optimization function, information on a method selected to obtain a focus, information as to whether to store a selected focus after optimization, and information indicating a range of a focus.

For example, the information 1130 on a filter optimization process may comprise information 1131 as to whether to use a filter optimization process, and information 1132 on a list of filters to be measure at a time of filter optimization.

As described above, the information on a filter optimization process may comprise at least part of information as to whether to use a filter optimization function, and information on a list of filters to be measured in the case where the filter optimization function is used.

For example, the information 1140 on an aperture optimization process may comprise information 1141 as to whether to use an aperture optimization process, and information 1142 on a list of apertures to be measured during an aperture optimization process.

As described above, the information on an aperture optimization process may comprise at least part of information as to whether to use an aperture optimization function, and information on a list of apertures to be measured in the case where the aperture optimization function is used.

For example, the information 1150 on a pinhole optimization process may comprise information 1151 as to whether to use a pinhole optimization process.

Figure 12:
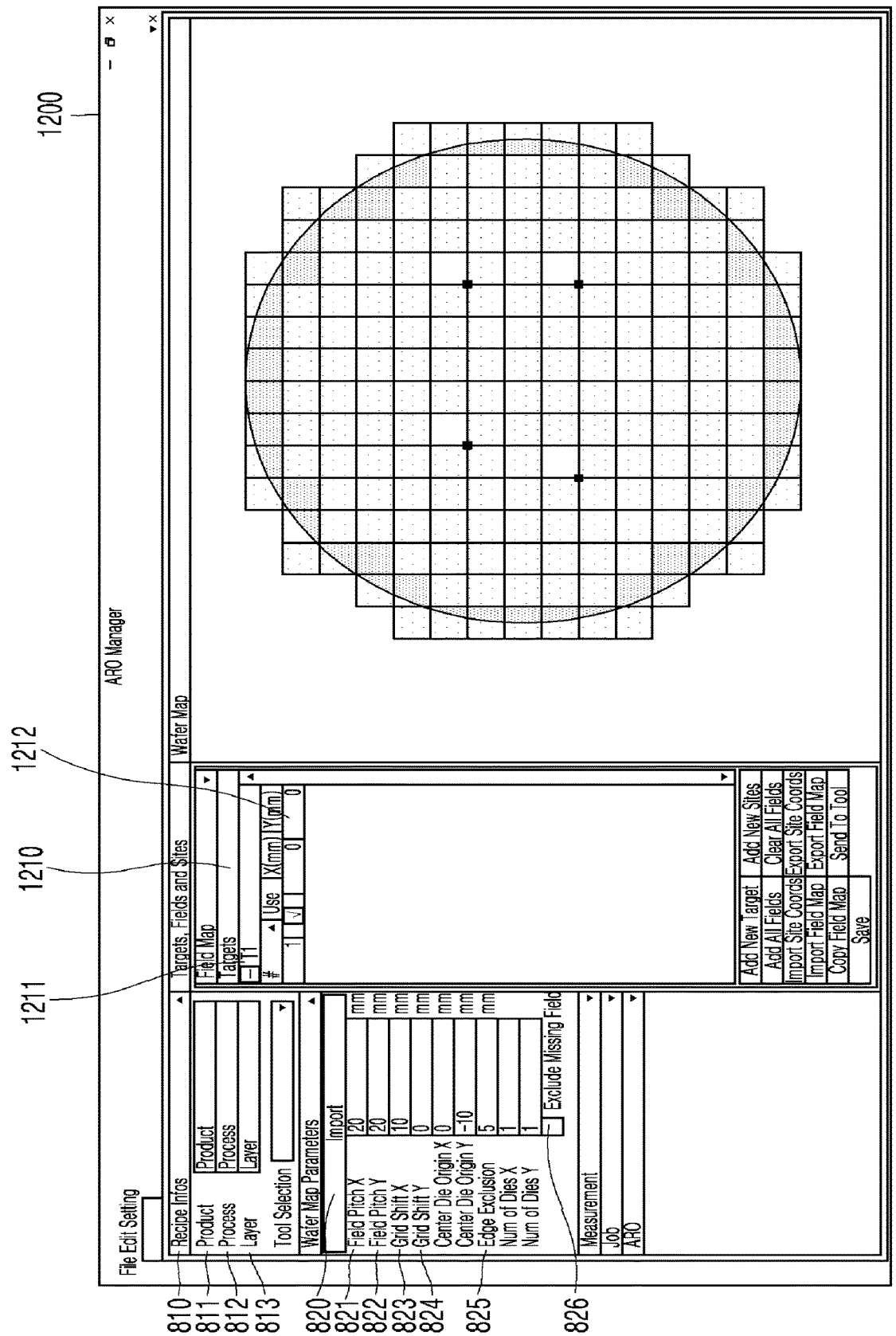
FIG. 12 is a fifth exemplary view showing the screen of the manager program to which information on a recipe of the measurement device 120 is input, in one embodiment.

FIG. 12 is a fifth exemplary view showing the screen of the manager program to which information on a recipe of the measurement device 120 is input, in one embodiment.

As illustrated in FIG. 12, the manager program may display a screen 1200 to which information on a target is input from the user.

In one embodiment, information 1211 on a target identifier (ID), and information 1212 on sites of the same target ID may be input to the screen 1200 of the manager program.

For example, the screen 1200 may comprise information 1211 on a target ID, and information 1212 on sites of the same target ID.

For example, the information 1212 on sites of the same target ID may comprise an index unique to each site, information as to whether each site is used for measurement, and information on an X-coordinate of a site and a Y-coordinate of a site.

As described above, according to the present disclosure, the overlay measurement device 120 may receive at least part of information of a recipe input to allow the overlay measurement device 120 to measure the characteristics of a wafer, and unique information of the overlay measurement device, through the manager program installed in the user terminal 110, and transmit the received information to the overlay measurement device, such that the manager of the user terminal 110 controls the operation of the overlay measurement device remotely.

Each of the above-described steps in the flowcharts may be performed regardless of the order illustrated, or performed at the same time. Further, in the present disclosure, at least one of the components, and at least one operation performed by at least one of the components can be embodied as hardware and/or software.

The embodiments are described above with reference to a number of illustrative embodiments thereof. However, embodiments are not limited to the embodiments and drawings set forth herein, and numerous other modifications and embodiments can be drawn by one skilled in the art within the technical scope of the disclosure. Further, the effects and predictable effects based on the configurations in the disclosure are to be included within the range of the disclosure though not explicitly described in the description of the embodiments.

The invention claimed is:

1. A non-transitory computer-readable storage medium that records a data computer-readable storage medium that records a data structure for storing data controlling an operation of an overlay measurement device that measures an error between a first overlay mark and a second overlay mark formed on different layers of a wafer, the data, comprising:

information of a recipe that is input to allow the overlay measurement device to measure characteristics of a wafer through a manager program installed in a user terminal, and unique information of the overlay measurement device, wherein the overlay measurement device comprises a light source, an aperture that changes a beam from the light source to be suitable for photographing the first overlay mark or the second overlay mark, a detector that acquires an image of the first overlay mark and an image of the second overlay mark, a transceiver, and a processor electrically connected to the transceiver, and wherein the processor is configured to obtain the data transmitted from the user terminal through the transceiver, analyze the recipe included in the data, when the analysis of the recipe is completed, perform optimization process for measurement options of the wafer based on the recipe, measure the aperture in a first pinhole position, measure the aperture in a second pinhole position that is a predetermined distance apart from the first pinhole position once, calculate Tis 3 Sigma in the first pinhole position and the second pinhole position, and perform a pinhole optimization process of selecting a pinhole position from the first pinhole position and the second pinhole position where the Tis 3 Sigma is a minimum by modeling the Tis 3 Sigma in each pinhole position in relation to the aperture.

2. The non-transitory computer-readable storage medium of claim 1, wherein the data comprises at least part of first information on configuration of a wafer map, second information of at least one of measurement options in relation to the wafer, third information of at least one of additional options in relation to the wafer, and fourth information indicating whether to perform optimization of the measurement options of the wafer.

3. The non-transitory computer-readable storage medium of claim 2, wherein the first information comprises at least part of a diameter of the wafer, a X-distance and a Y-distance of a field, a central coordinate of the field, information as to whether a field that is not completely in the wafer is used or whether to use a field that is not completely in the wafer, and a thickness that is not to be measured at an end of the wafer.

4. The non-transitory computer-readable storage medium of claim 2, wherein the second information comprises at least part of information on settings in relation to target measurement, information on optical settings at a time of measurement, and information on algorithm settings used at the time of measurement.

5. The non-transitory computer-readable storage medium of claim 4, wherein the information on algorithm settings used at the time of measurement comprises information about a type and a level of an advanced frame sampling strategy (AFSS) mode.

6. The non-transitory computer-readable storage medium of claim 2, wherein the third information of at least one additional option for the wafer comprises at least part of information on a selection of a measurement mode, information as to whether to use an image storage function, information as to whether to use an auto data file storage function, information as to whether to use a manual assist function, information on conditions for performance of an auto pinhole optimization function, information as to whether to use an auto wafer center calibration function, and information as to whether a target finder function is used or whether to use a target finder function.

7. The non-transitory computer-readable storage medium of claim 2, wherein the fourth information comprises at least part of information on a filter optimization process, information on an aperture optimization process, information on a focus optimization process, and information on a pinhole optimization process.

8. The non-transitory computer-readable storage medium of claim 7, wherein the information on a pinhole optimization process comprises information as to whether a pinhole optimization function is used or whether to use a pinhole optimization function.

* * * * *